(12) United States Patent
Ha

(10) Patent No.: US 8,289,794 B2
(45) Date of Patent: *Oct. 16, 2012

(54) INTEGRATED CIRCUIT

(75) Inventor: Sung-Joo Ha, Gyeonggi-do (KR)

(73) Assignee: Hynix Semiconductor Inc., Gyeongg-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/009,131

(22) Filed: Jan. 19, 2011

(65) Prior Publication Data

US 2011/0110167 A1    May 12, 2011

Related U.S. Application Data

(63) Continuation of application No. 12/262,269, filed on Oct. 31, 2008, now Pat. No. 7,940,586.

(30) Foreign Application Priority Data

Nov. 2, 2007 (KR) .................. 10-2007-0111615

(51) Int. Cl.
*G11C 29/00* (2006.01)
(52) U.S. Cl. .................. 365/201; 365/191; 365/230.01
(58) Field of Classification Search .................. 365/201, 365/191, 230.1
See application file for complete search history.

(56) References Cited

U.S. PATENT DOCUMENTS 5,793,685 A * 8/1998 Suma .................. 365/201
2002/0034112 A1 * 3/2002 Kato et al. .................. 365/201

* cited by examiner

*Primary Examiner* — Vu Le
*Assistant Examiner* — Han Yang
(74) *Attorney, Agent, or Firm* — IP & T Group LLP

(57) ABSTRACT

An integrated circuit includes a global I/O line (GIO) for transmitting read data and write data between a peripheral region and a core region when a read/write operation is activated, and a test circuit for transmitting/receiving test data through the global I/O line to test the integrated circuit, when a test operation is activated.

18 Claims, 4 Drawing Sheets

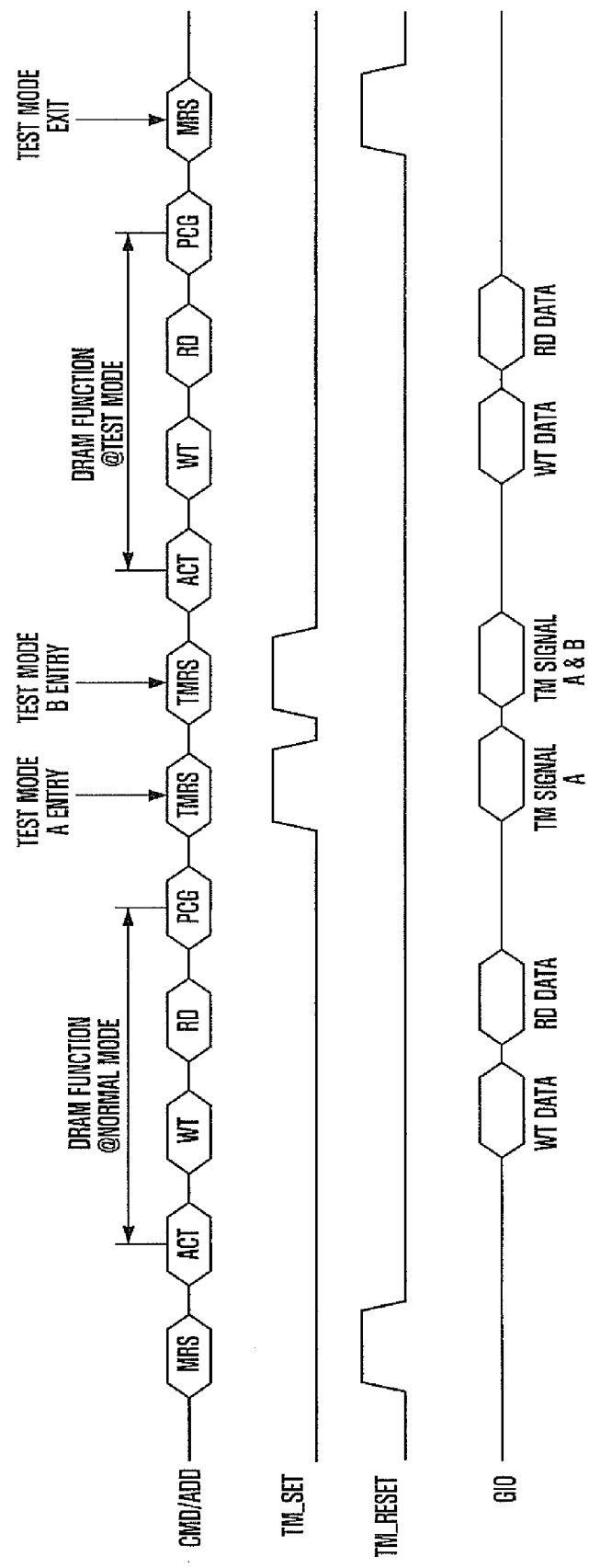

INTEGRATED CIRCUIT

CROSS-REFERENCE TO RELATED APPLICATIONS

This application is a continuation of U.S. patent application Ser. No. 12/262,269 filed on Oct. 31, 2008 now U.S. Pat. No. 7,940,586, which claims priority of Korean patent application number 10-2007-0111615 filed on Nov. 2, 2007. The disclosure of each of the foregoing applications is incorporated herein by reference in their entirety.

BACKGROUND OF THE INVENTION

The present invention relates to an integrated circuit, such as a semiconductor memory device, and more particularly, an integrated circuit for reducing the number of additional circuits required when the integrated circuit is tested.

In a system having a plurality of integrated circuits, an integrated circuit, such as a semiconductor memory device, is used for data storage. When a data processor device (for example, a central processor unit CPU) demands data, the integrated circuit outputs the demanded data in accordance with an address inputted from the data processor device or stores the demanded data at a cell memory in accordance with the address.

As the operating speed of a system having integrated circuits increases, and a technique related to an integrated circuit develops, the integrated circuit is required to output and store data more rapidly. Recently, integrated circuits have been required to store more data and to perform READ/WRITE operations more rapidly.

As described above, design, fabrication, and testing of integrated circuits is becoming more complicated and difficult.

FIG. 1 is a block diagram describing a circuit related to a test operation of a conventional semiconductor memory device.

Referring to FIG. 1, the semiconductor memory device includes a command and address block 120, a test mode decoder 140, a plurality of latches 160_1 to 160_6 and a plurality of test control circuits 180_1 to 180_6. The plurality of test control circuits 180_1 to 180_6 are for controlling various test operations performed in elements of an internal semiconductor memory device.

The elements may be divided for testing into a number of groups according to different criteria, including, for example, into a peripheral region and a core region according to a layout, into a bank, an input/output peripheral circuit and an internal voltage circuit according to a function, or into parts related to a read/write operation region and a precharge operation region according to an internal performing operation.

Many kinds of test modes are required to sort various inferior parts in the semiconductor memory device. The many kinds of test modes are identified by combining a command CMD and an address ADD inputted to the command and address block 120.

The command and address block 120 generates a test mode code TMCODE for representing a test mode selected among various test modes, a test mode start signal TM_SET for representing a start of the test mode according to the test mode code TMCODE, and the test mode reset signal TM_RESET for representing a reset of the test mode according to the test mode code TMCODE by decoding the command CMD and the address ADD.

The test mode decoder 140 receives the test mode code TMCODE and the test mode start signal TM_SET and activates a test mode signal TM_A to TM_F for testing the element according to the decoded command CMD and the address ADD received. The test mode signals TM_A to TM_F are latched in the plurality of latches 160_1 to 160_6 corresponding to the test mode reset signal TM_RESET and used for various tests by the plurality of test control circuits 180_1 to 180_6 in the internal semiconductor memory device.

The test mode signals TM_A to TM_F are transmitted to the plurality of test control circuits 180_1 to 180_6 to change a test mode and a start timing of the test operation. The test mode signal TM_A to TM_F is stored in the plurality of latches 160_1 to 160_6 so as to perform a plurality of test modes simultaneously. The plurality of latches 160_1 to 160_6 are reset respectively when the test mode reset signal TM_RESET is inputted from the command and address block 120. The test mode reset signal TM_RESET can be generated by a result of decoding the command CMD and the address ADD or a command of a mode resistor set MRS.

As described above, for transmitting the test mode signal TM_A to TM_F to the plurality of test control circuit 180_1 to 180_6, a plurality of test mode signal transmission line TM_A' to TM_F' is required.

If a distance from the plurality of latches 160_1 to 160_6 to the plurality of test control circuit 180_1 to 180_6 is greater, a length of the test mode signal transmission line TM_A' to TM_F' has to lengthen like a global input/output (I/O) lines GIO.

To store much more data, to input/output data more rapidly and to reduce a power consumption, an internal structure of the semiconductor memory device has become more complicated. Therefore, test modes for the semiconductor memory device have increased and test items of the semiconductor memory are varied. There are various test methods to test for high conductivity of a semiconductor memory device. As the test mode is changed in accordance with an operating environment and its surrounding environment, a number of the test mode signal TM_A to TM_F are increased, and a number of the test mode signal transmission line TM_A' to TM_F' is also increased consequently.

FIG. 2 illustrates a structure for data transmitting between the peripheral region and the core region of a conventional semiconductor memory device.

Referring to FIG. 2, the semiconductor memory device comprises the core region including a unit cell for storing data, the peripheral region transmitting data to the core region or external and the global I/O lines GIO connecting the peripheral region to the core region.

Concretely, the respective global I/O lines GIO transmit data between a I/O sense amplifier IOSA and a test mode driver TM_DRV of the core region and the I/O multiplexer DQ_MUX and a pad sense amplifier DIN_IOSA of the peripheral region.

When a read operation is performed, data from a unit cell is transmitted to an I/O multiplexer DQ_MUX through the I/O sense amplifier IOSA, and outputted to an external. When a write operation is performed, data inputted externally are detected by the pad sense amplifier DIN_IOSA, and transmitted to a write driver WT_DRV and stored at the unit cell.

As the operating speed of the semiconductor memory device increases and the number of processing (for example, reading or writing) data bits at one-time are increased, the number of the global I/O lines GIO is increased. For example, when 16 bit data is inputted or outputted at one time, 32 of the global I/O lines GIO are required for double data rate (DDR).

64 of the global I/O lines GIO are required for DDR2, and 128 of the global I/O lines GIO are required for DDR3.

FIG. 3 is a circuit diagram describing an internal structure of the semiconductor memory device depicted in FIG. 2. Referring to FIG. 3, the I/O sense amplifier IOSA, the I/O multiplexer DQ_MUX and the pad sense amplifier DIN_IOSA are each connected to the global I/O lines GIO and transmit data, when a read operation or a write operation is performed. When the read operation or the write operation is not performed, they are isolated to the global I/O lines GIO.

In detail, the I/O sense amplifier IOSA and the pad sense amplifier DIN_IOSA include driving units which include a PMOS transistor and a NMOS transistor. When the read operation is performed, the PMOS and NMOS transistors in the I/O sense amplifier IOSA are turned-on in response to signals RD_H_B and RD_L corresponding data outputted from the unit cell, and supply a drive voltage or a ground voltage for the global I/O lines GIO. When the read operation is not performed, the PMOS and NMOS transistors in the I/O sense amplifier IOSA are turned-off, so that the I/O sense amplifier IOSA is in a floating state by disconnecting to the global I/O lines GIO.

Similar to the I/O sense amplifier IOSA, the pad sense amplifier DIN_IOSA includes driving units which include a PMOS transistor and a NMOS transistor. The PMOS and NMOS transistors turned-on in response to signals WT_H_B and WT_L correspond to an input data from the external, and supply a drive voltage or a ground voltage for the global I/O lines GIO, when the write operation is performed. When the write operation is not performed, the PMOS and NMOS transistors are turned-off, so that the I/O sense amplifier IOSA is in a floating state by disconnecting to the global I/O lines GIO.

The write driver WT_DRV and the I/O multiplexer DQ_MUX includes a transmission gate, not driving unit which includes a PMOS transistor and a NMOS transistor. The global I/O lines GIO are connected to the I/O multiplexer DQ MUX in response to read enable signal RD_EN_B and RD_EN, when the read operation is performed. The global I/O lines GIO are connected to the write driver WT_DRV in response to write enable signal WT_EN_B and WT_EN, when write operation is performed. On the contrary, when the read/write operation is not performed, the connection of the write driver WT_DRV/the I/O multiplexer DQ_MUX and the global I/O lines GIO is disconnected and the global I/O lines GIO are in a floating state.

Recently, as the number of the global I/O lines GIO has increased, a region where the global I/O lines GIO is located has begun to affect the whole semiconductor chip. Particularly, as the transmission line for transmitting test data as well as the global I/O lines GIO are increased, a region where the global I/O lines GIO and the transmission line are located is further increased. This increased region becomes a burden to a high integrated circuit of semiconductor memory device.

SUMMARY OF THE INVENTION

Embodiments of the invention are directed to provide an integrated circuit, such as a semiconductor memory device, and more particularly, an integrated circuit for reducing additional circuits required, when the integrated circuit is tested.

In accordance with an aspect of the invention, there is provided an integrated circuit that includes a global I/O line GIO for transmitting read data and write data between a peripheral region and a core region when a read/write operation is activated; a test circuit for transmitting/receiving a test data through the global I/O line to test the integrated circuit, when a test operation is activated.

In accordance with another aspect of the invention, there is provided an integrated circuit that includes a test mode driver for transmitting a test mode signal including a test data to the global I/O line in response to a test mode start signal and a test mode reset signal, a test mode latch for latching the test mode signal received from the global I/O line in response to the test mode start signal and the test mode reset signal, and a transceiving circuit for transmitting/receiving a read data and write data through the global I/O line between a peripheral region and a core region when a read/write operation is activated.

BRIEF DESCRIPTION OF THE DRAWINGS

FIG. 7 is a diagram describing an operation of the integrated circuit in FIG. 4.

DESCRIPTION OF SPECIFIC EMBODIMENTS

Hereinafter, an integrated circuit in accordance with the present invention will be described in detail with reference to the accompanying drawings.

Figure 1:
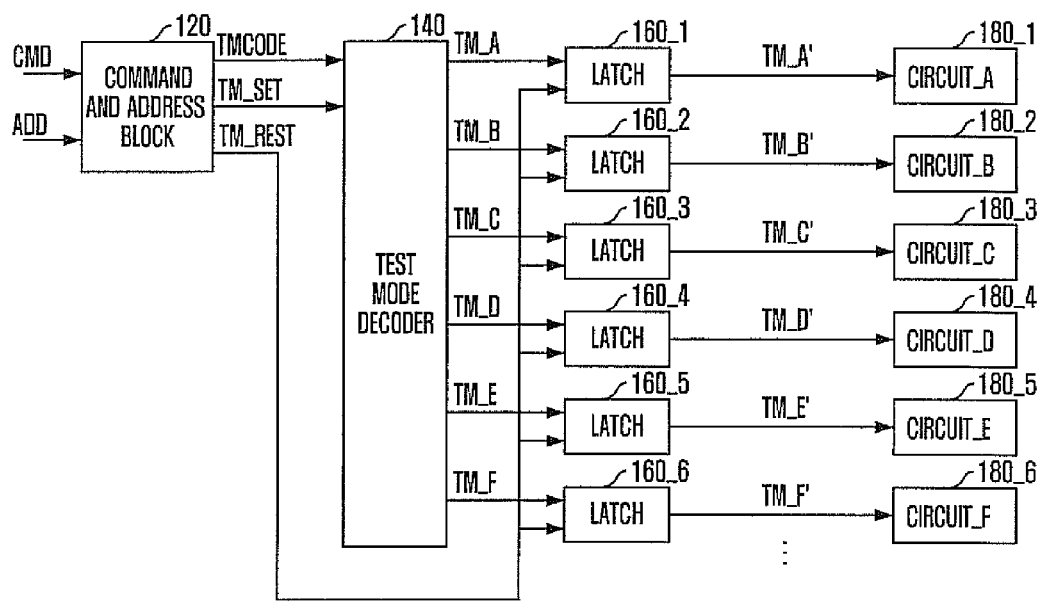
FIG. 1 is a block diagram describing a circuit related to a test operation of a conventional semiconductor memory device.
Figure 2:
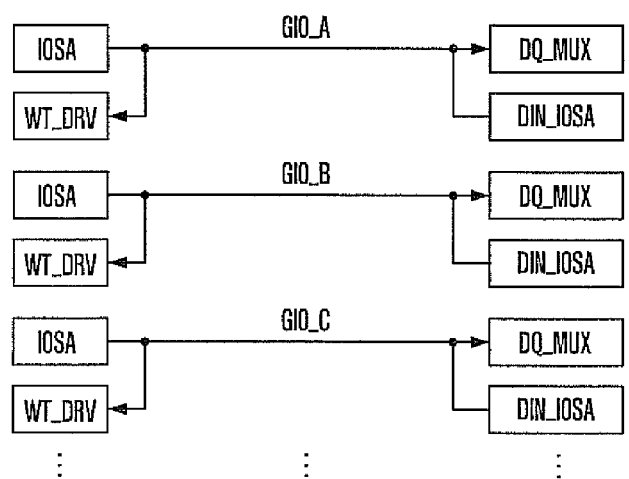
FIG. 2 is a block diagram describing a structure for data transmitting between the peripheral region and the core region of a conventional semiconductor memory device.
Figure 3:
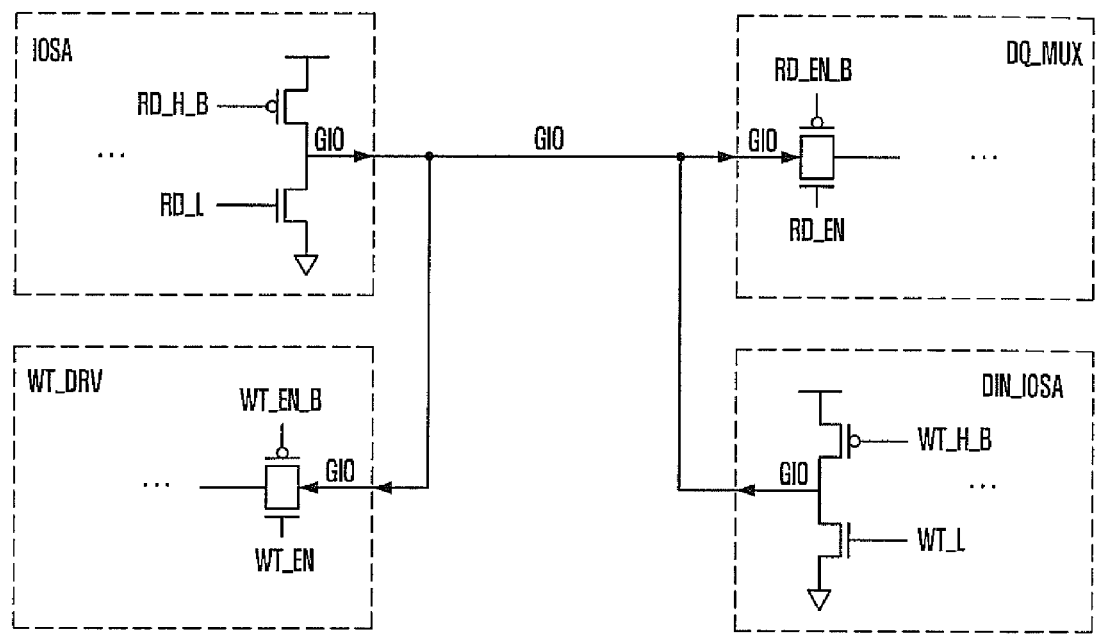
FIG. 3 is a circuit diagram describing an internal structure of the semiconductor memory device in FIG. 2.
Figure 4:
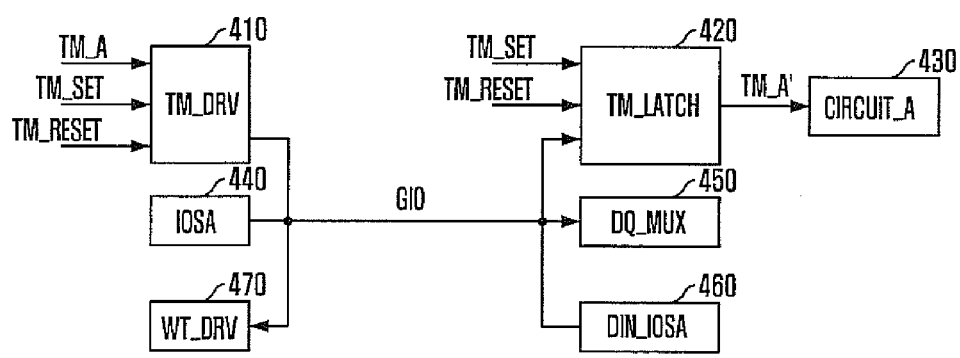
FIG. 4 is a block diagram describing a structure for data transmitting between a peripheral region and a core region of an integrated circuit in accordance with the embodiments of the present invention.

FIG. 4 illustrates a structure for read data and write data transmitting between a peripheral region and a core region of an integrated circuit in accordance with the embodiment of the present invention.

Referring to FIG. 4, the integrated circuit includes a test circuit for transmitting test data to global input/output (I/O) lines when a test mode of the integrated circuit is activated, and a data transceiving circuit for transmitting/receiving read data and write data through the global I/O lines between the peripheral region and the core region when a read operation or a write operation is performed.

Unlike a general integrated circuit, the integrated circuit in accordance with an embodiment of the present invention transmits the test data using the global I/O lines as well as the data transceiving circuit.

Therefore, the global I/O lines transmit the write data to the peripheral region or receive from the core region of the integrated circuit when the read operation or the write operation is performed. The test mode signal TM_A including the test data is transmitted to the global I/O lines, when the test mode is activated.

In the present invention, the core region represents a region including a plurality of unit cells for storing data and a bit line sense amplifier. The peripheral region represents a region including lines and circuits for transmitting a signal and data between the core region and an external of the integrated circuit. The peripheral region includes a plurality of I/O pads.

The integrated circuit includes a plurality of the global I/O lines and transmits a plurality of data as well as a plurality of the test data. The respective test data are transmitted through the respective global I/O lines.

In detail, the test circuit includes a test mode driver TM_DRV 410, a test mode latch TM_LATCH 420 and a test control circuit CIRCUIT_A 430. The test mode driver TM_DRV 410 transmits the test mode signal TM_A to the global I/O line GIO in response to a test mode start signal TM_SET and a test mode reset signal TM_RESET. The test mode latch TM_LATCH 420 latches the test mode signal TM_A received from the global I/O line GIO in response to the test mode start signal TM_SET and the test mode reset signal TM_RESET. The test control circuit CIRCUIT_A 430 controls a test in response to information stored temporarily in the test mode latch TM_LATCH 420.

The data transceiving circuit includes an I/O sense amplifier IOSA 440, an I/O multiplexer DQ_MUX 450, a pad sense amplifier DIN_IOSA 460 and a write driver WT_DRV 470. The I/O sense amplifier IOSA 440 detects a read data outputted from the core region to amplify the detected data and transmit the amplified data to the global I/O line GIO when the read operation is performed. The I/O multiplexer DQ_MUX 450 outputs the read data from the global I/O line GIO to an external when the read operation is performed. The pad sense amplifier DIN_IOSA 460 detects and amplifies the write data inputted from the external and transmits the write data, which are detected and amplified, to the global I/O line GIO, when the write operation is performed. The write driver WT_DRV 470 receives the write data from the global I/O line GIO, and transmits the received write data to the core region, when the write operation is performed.

Figure 5:
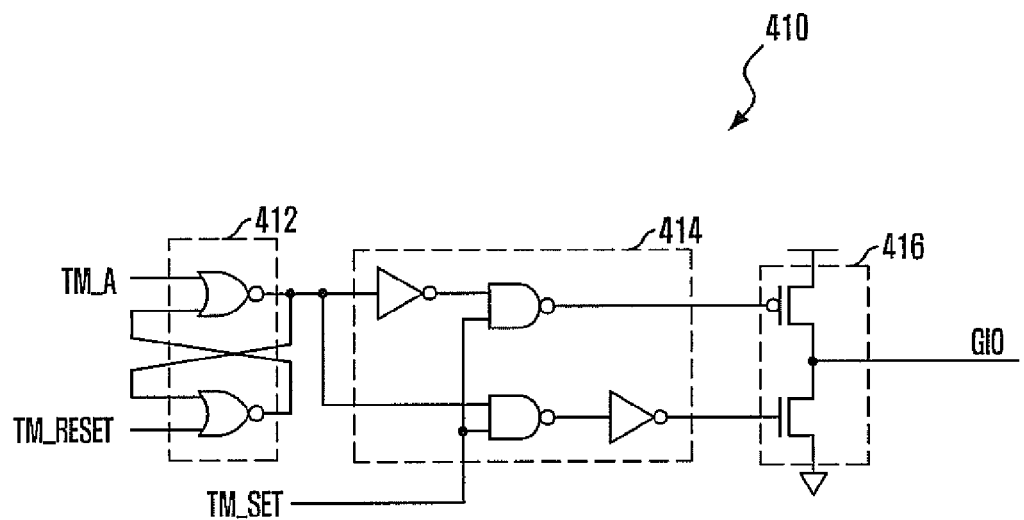
FIG. 5 is a circuit diagram describing the test mode driver TM_DRV in FIG. 4.

FIG. 5 is a circuit diagram describing the test mode driver TM_DRV 410 in FIG. 4.

As shown in FIG. 5, the test mode driver TM_DRV 410 includes a latch unit 412, a logic unit 414 and a driver unit 416.

The latch unit 412 inverts the test mode signal TM_A to output it, when the test mode reset signal TM_RESET is deactivated and the latch unit 412 outputs a deactivation signal having a logic high level irrespective of the test mode signal TM_A, when the test mode reset signal TM_RESET is activated. The logic unit 414 processes an output signal from the latch unit 412, when the test mode start signal TM_SET is activated. The driver unit 416 drives the global I/O line with a signal having a logic level corresponding to the test mode signal TM_A according to an output signal from the logic unit 414. The driver unit 416 applies a signal having a logic level corresponding to the test mode signal TM_A to the global I/O line.

In detail, the latch unit 412 can include two NOR gates. An input port of each NOR gate is cross-connected to an output port of the other NOR gate. The logic unit 414 for receiving the output signal from the latch unit 412. The logic unit 414 includes a first inverter for inverting the output signal received from the latch unit 412 and outputting the inverted signal. The logic unit 414 further includes a first logic gate for receiving an output signal of the first inverter and outputting the received signal as a first output signal, when the test mode reset signal TM_RESET is activated in logic high. The first logic gate outputs a signal having a logic high state as a second output signal, when the test mode reset signal TM_RESET is inactivated. The logic unit 414 further includes a second logic gate for receiving and outputting the output signal from the logic unit 414 as a third output signal, when the test mode start signal TM_SET is activated in logic high. The second logic gate outputs a signal having a logic high state as a fourth output signal, when the test mode start signal TM_SET is inactivated. The logic unit 414 further includes a second inverter for inverting the third/fourth output signal from the second logic gate.

The driver unit 416 includes a first MOS transistor and a second MOS transistor. The first MOS transistor transmits a logic high signal to drive the global I/O line GIO in response to the first/second output signal from the first logic gate. The second MOS transistor transmits a logic low signal to drive the global I/O line GIO in response to the third/fourth output signal from the second logic gate.

The operation of the test mode driver 410 can be described referring to FIG. 4 and FIG. 5. The test mode driver 410 outputs the test mode signal TM_A to the global I/O line GIO, when the test mode start signal TM_SET is activated and the test mode reset signal TM_RESET is inactivated. In other words, the decoded test mode signal TM_A is latched in the latch unit 412, when the test mode reset signal TM_RESET is inactivated. The decoded test mode signal TM_A is transmitted to the global I/O line, when the test mode set signal TM_SET is activated. The latch unit 412 is reset, when the test mode reset signal TM_RESET is activated.

The test mode signal TM_A is stored in the latch unit 412 of the test mode driver 410 for performing a plurality of test modes in simultaneous or in parallel.

As describe above, FIG. 4 shows an embodiment that the test mode signal TM_A is transmitted through single global I/O line. However, the integrated circuit of the present invention can transmit different information related to a plurality of different test modes through a plurality of global I/O lines in simultaneous or in parallel.

As the global I/O line GIO is used for test operation when the test command is inputted only, the integrated circuit of the present invention can stop transmitting all of the information related to the test mode by resetting the latch unit 412 by using the test mode reset signal TM_RESET generated by a mode resister set (MRS).

Figure 6:
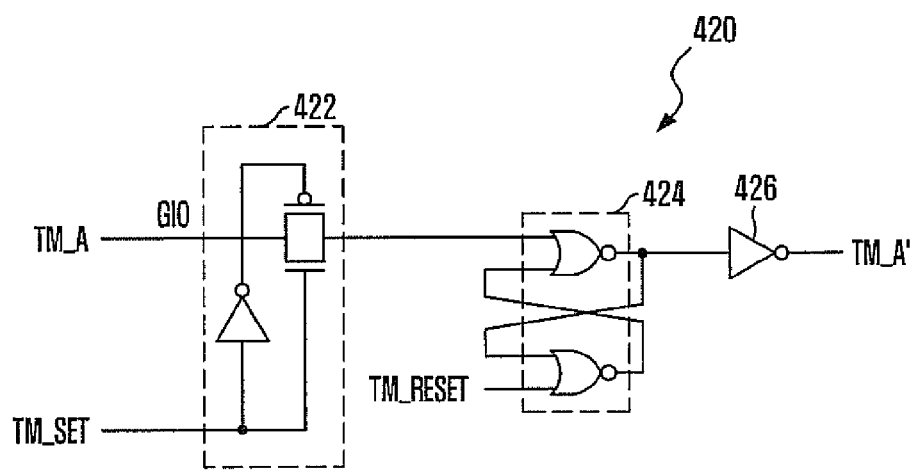
FIG. 6 is a circuit diagram describing the test mode latch TM_LATCH in FIG. 4.

FIG. 6 is a circuit diagram describing the test mode latch TM_LATCH 420 in FIG. 4.

Referring to FIG. 6, the test mode latch TM_LATCH 420 includes a transmission gate 422, a latch unit 424 and an inverter 426.

The transmission gate 422 receives the test mode signal TM_A from the global I/O line GIO, and transmits the test mode signal TM_A to the latch unit 424. The latch unit 424 inverts and output the test mode signal TM_A received from the transmission gate 422, when the test mode reset signal TM_RESET is inactivated. The latch unit 424 outputs an inactivation signal having a logic high level, when the test mode reset signal TM_RESET is activated. The inverter 426 inverts the test mode signal TM_A or the inactivation signal output from the latch unit 424 and outputs the inverted signal as a signal TM_A'.

In detail, the test mode signal TM_A received from the global I/O line GIO is stored in the latch unit 424 through the transmission gate 422, when the test mode start signal TM_SET is activated.

The latch unit 424 is reset by the test mode reset signal TM_RESET generated by the mode resister set (MRS) such as the latch unit 414 is reset.

FIG. 7 is a diagram describing an operation of the integrated circuit in FIG. 4.

Referring to FIG. 7, all of the test circuits are initialized by the test mode reset signal TM_RESET, which is activated in accordance with command outputted from the mode resister set (MRS). The integrated circuit performs a precharge operation PCG in accordance with an active command ACT, after the read/write operation.

Then, the test mode start signal TM_SET is activated, when the test command TMRS is inputted and the test mode signal TM_A is activated in accordance with the test mode start signal TM_SET by inputting test mode A and B ENTRY inputted with test command TMRS. The activated test mode signal TM_A is transmitted to the test control circuit of the integrated circuit. The test of the integrated circuit can be performed respectively or can be performed simultaneously in several test modes. At this time, test mode signals TM SIGNAL A & TM SIGNAL B corresponding to each test modes are transmitted to the control circuit through the global I/O line GIO.

First, the first test mode signal TM SIGNAL A includes information related to TEST MODE A ENTRY, and is transmitted through one global I/O line GIO. Second, the test mode signal TM SIGNAL B includes information related to TEST MODE B ENTRY, and is transmitted through another global I/O line GIO. The test mode signal TM SIGNAL B is transmitted with a second test command TMRS and test mode signal TM SIGNAL A latched.

Third, after the test start signal TM_SET is inactivated, a write data WT DATA and a read data RD DATA are transmitted through the global I/O line GIO during the writing/reading operation (WT/RD) by active command ACT. Finally, the test mode is completed by the test mode reset signal TM_RESET, which are activated by a command outputted from the mode resister set (MRS).

Recently, the test mode of the integrated circuit is increased for easy analysis of failure and reducing the period of development in accordance with increase of storage capacity and operating speed.

As the number of lines for transmitting information related to various test modes is increased and higher speed of data I/O, many of the global I/O line GIO is required. The integrated circuit of the present invention can transmit test data, read data, and write data through the global I/O line GIO.

For example, as the operating speed of the integrated circuit is higher, a DDR is operated at one time with 16 bit data and required 32 of the global I/O lines GIO, a DDR2 is operated at one time with 64 bit data and required 128 of the global I/O lines GIO, and a DDR3 required 128 of the global I/O lines GIO.

As described above, a design and a fabrication of the integrated circuit is easier. In a region where the global I/O lines GIO is located decreased, the integrated circuit of the present invention can reduce a whole chip size of the integrated circuit.

While the invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
 a plurality of memory device elements;
 a data bus line operatively coupling said memory device elements;
 a transceiving circuit for transmitting or receiving read data and write data through the data bus line when a read/write operation is activated; and
 a test circuit for transmitting/receiving a test mode signal including test data through the data bus line to test at least one of the memory device elements, when a test operation is activated,
 wherein the test circuit includes a test mode driver for transmitting the test mode signal including test data, on the data bus line in response to a test mode start signal and a test mode reset signal.

2. The integrated circuit as recited in claim 1, wherein the test circuit further comprises:
 a test mode latch for latching the test mode signal on the data bus line in response to the test mode start signal and the test mode reset signal.

3. The integrated circuit as recited in claim 2, further comprising a test control circuit for controlling a test in response to the latched data in the test mode latch.

4. The integrated circuit as recited in claim 2, wherein the test mode driver includes:
 a latch unit for inverting and outputting the test mode signal when the test mode reset signal is inactivated, and outputting an inactivation signal when the test mode reset signal is activated;
 a logic unit for processing a signal output by the latch unit when the test mode start signal is activated; and
 a drive unit for driving the data bus line according to a signal output by the logic unit.

5. The integrated circuit as recited in claim 4, wherein the latch unit includes two NOR gates, an input port of each NOR gate being cross-connected to an output port of the other NOR gate.

6. The integrated circuit as recited in claim 4, wherein the logic unit includes:
 a first inverter for inverting and outputting the signal output by the latch unit;
 a first logic gate for receiving and outputting an signal output by the first inverter as a first output signal when the test mode start signal is activated, and outputting a second output signal when the test mode start signal is inactivated;
 a second logic gate for receiving and outputting the signal output by the logic unit as a third output signal when the test mode start signal is activated, and outputting a fourth output signal when the test mode start signal is inactivated; and
 a second inverter for inverting and outputting the third or the fourth output signal from the second logic gate.

7. The integrated circuit as recited in claim 6, wherein the drive unit includes:
 a first MOS transistor for driving the data bus line in response to the first or the second output signal from the first logic gate; and
 a second MOS transistor for driving the data bus line in response to the third or the fourth output signal from the second logic gate.

8. The integrated circuit as recited in claim 2, wherein the test mode latch includes:
 a transmission gate for receiving the test mode signal on the data bus line, and outputting the test mode signal in response to the test mode start signal;
 a latch unit for inverting and outputting the test mode signal when the test mode reset signal is inactivated, and outputting an inactivation signal when the test mode reset signal is activated; and
 an inverter for inverting and outputting the test mode signal or the inactivation signal output from the latch unit.

9. The integrated circuit as recited in claim 1, further comprising:
 an input/output sense amplifier for sensing and amplifying the read data and transmitting the read data to the data bus line when the read operation is performed;

an input/output multiplexer for outputting the read data from the data bus line when the read operation is performed;

a pad sense amplifier for sensing and amplifying the write data, and transmitting the write data to the data bus line when the write operation is performed; and a write driver for receiving the write data from the data bus line and transmitting the write data when the write operation is performed.

10. An integrated circuit, comprising:

a test mode driver for transmitting a test mode signal including test data to a data bus line in response to a test mode start signal and a test mode reset signal;

a test mode latch for latching the test mode signal received on the data bus line in response to the test mode start signal and the test mode reset signal; and a transceiving circuit for transmitting/receiving read data and write data through the data bus line when a read operation or a write operation, respectively, is activated.

11. The integrated circuit as recited in claim 10, further comprising a test control circuit for controlling a test in response to the test mode signal latched in the test mode latch.

12. The integrated circuit as recited in claim 10, wherein the test mode driver includes:

a latch unit for inverting and outputting the test mode signal when the test mode reset signal is inactivated, and outputting an inactivation signal when the test mode reset signal is activated;

a logic unit for processing a signal output by the latch unit when the test mode start signal is activated; and a drive unit for driving the data bus line according to a signal output by the logic unit.

13. The integrated circuit as recited in claim 12, wherein the latch unit includes two NOR gates, an input port of each NOR gate being cross-connected to an output port of the other NOR gate.

14. The integrated circuit as recited in claim 12, wherein the logic unit includes:

a first inverter for inverting and outputting the output signal from the latch unit;

a first logic gate for receiving and outputting a signal output by the first inverter as a first output signal when the test mode start signal is activated, and outputting a second output signal when the test mode start signal is inactivated;

a second logic gate for receiving and outputting the signal output by the logic unit as a third output signal when the test mode start signal is activated, and outputting a fourth output signal when the test mode start signal is inactivated; and a second inverter for inverting and outputting the third or the fourth output signal from the second logic gate.

15. The integrated circuit as recited in claim 14, wherein the drive unit includes:

a first MOS transistor for driving the data bus line in response to the first or the second output signal from the first logic gate; and a second MOS transistor for driving the data bus line in response to the third or the fourth output signal from the second logic gate.

16. The integrated circuit as recited in claim 10, wherein the test mode latch includes:

a transmission gate for receiving the test mode signal on the data bus line, and outputting the test mode signal in response to the test mode start signal;

a latch unit for inverting and outputting the test mode signal when the test mode reset signal is inactivated, and outputting an inactivation signal when the test mode reset signal is activated; and an inverter for inverting and outputting the test mode signal or the inactivation signal output from the latch unit.

17. The integrated circuit as recited in claim 16, wherein the latch unit includes two NOR gates, an input port of each NOR gate being cross-connected to an output port of the other NOR gate.

18. The integrated circuit as recited in claim 10, wherein the transceiving circuit includes:

an input/output sense amplifier for sensing and amplifying the read data and transmitting the read data onto the data bus line when the read operation is performed;

an input/output multiplexer for outputting the read data on the data bus line when the read operation is performed;

a pad sense amplifier for sensing and amplifying the write data, and transmitting the write data onto the data bus line when the write operation is performed; and a write driver for receiving the write data on the data bus line and transmitting the write data when the write operation is performed.

* * * * *